United States Patent
Teranishi

(10) Patent No.: US 9,673,909 B2
(45) Date of Patent: Jun. 6, 2017

(54) OPTICAL RECEIVER MODULE PROVIDING SEMICONDUCTOR OPTICAL AMPLIFIER

(71) Applicant: Sumitomo Electric Device Innovations, Inc., Yokohama-shi (JP)

(72) Inventor: Ryota Teranishi, Yokohama (JP)

(73) Assignee: Sumitomo Electric Device Innovations, Inc., Yokohoma-shi (JP)

( * ) Notice: Subject to any disclaimer, the term of this patent is extended or adjusted under 35 U.S.C. 154(b) by 0 days.

(21) Appl. No.: 14/794,283

(22) Filed: Jul. 8, 2015

(65) Prior Publication Data
US 2016/0013869 A1 Jan. 14, 2016

(30) Foreign Application Priority Data
Jul. 9, 2014 (JP) .................................. 2014-141627

(51) Int. Cl.
| | | |
|---|---|---|
| H04B 10/25 | (2013.01) | |
| H04B 10/60 | (2013.01) | |
| H01S 5/022 | (2006.01) | |
| H01S 5/50 | (2006.01) | |

(52) U.S. Cl.
CPC .......... H04B 10/60 (2013.01); *H01S 5/02284* (2013.01); *H01S 5/50* (2013.01)

(58) Field of Classification Search
CPC .. H01S 5/02284; H01S 5/146; H01S 3/06754; G02B 6/4206
USPC .......................................................... 398/210
See application file for complete search history.

(56) References Cited

U.S. PATENT DOCUMENTS

| | | | | |
|---|---|---|---|---|
| 2003/0072076 | A1* | 4/2003 | Yoon ................... | H01S 5/02284 359/344 |
| 2003/0179997 | A1* | 9/2003 | Hwang .................. | G02B 6/266 385/34 |
| 2004/0264888 | A1* | 12/2004 | Go ......................... | G02B 6/325 385/92 |
| 2005/0185889 | A1* | 8/2005 | Xia ........................ | B82Y 20/00 385/43 |
| 2013/0148970 | A1* | 6/2013 | Nakajima ............... | H04J 14/02 398/79 |

FOREIGN PATENT DOCUMENTS

JP H6-232814 8/1994

* cited by examiner

*Primary Examiner* — Don N Vo
(74) *Attorney, Agent, or Firm* — Venable LLP; Michael A. Sartori; F. Brock Riggs

(57) ABSTRACT

An optical receiver module that provides a semiconductor optical amplifier (SOA) is disclosed. The optical receiver module provides the SOA in another housing and a photodiode (PD) enclosed in another housing. The housing for the SOA and the other housing for the PD are fixed as interposing a coupling unit therebetween, which is rigidly fixed to those housings. The coupling unit has a bore that passes light output from a facet of the SOA and received by the PD. A feature of the coupling unit is that a width or diameter of the bore of the coupling unit is smaller than widths of respective housings along a direction perpendicular to the optical axis of the light.

20 Claims, 11 Drawing Sheets

-- Prior Art --

OPTICAL RECEIVER MODULE PROVIDING SEMICONDUCTOR OPTICAL AMPLIFIER

BACKGROUND OF THE INVENTION

1. Field of the Invention

The present invention relates to an optical receiver module providing a semiconductor optical amplifier (SOA), in particular, the invention relates to an optical receiver module that suppresses stray light caused by an amplified spontaneous emission (ASE) of the SOA from affecting a semiconductor photodiode (PD) that receives an optical signal amplified by the SOA.

2. Related Background Arts

Recent optical communication system often provides an SOA to amplify attenuated optical signal. FIG. 10 schematically illustrates a functional block diagram of a conventional optical receiver module, which includes an SOA 100, a semiconductor optical device 102 that receives an optical signal amplified by the SOA 100. The SOA 100 and the optical device 102 are commonly enclosed within a housing 104, and the housing 104 provides a coupling unit 106 to couple an external optical fiber therewith. The optical signal is provided from the external optical fiber to the SOA through the coupling unit 106.

The SOA often accompanies with an amplified spontaneous emission (ASE) which may be a source of stray light. The optical device 102, not only the amplifier optical signal coming from the SOA 100, but receives the stray light as noise light, which degrades the optical sensitivity of the receiver module. When the optical device is a light emitting device, typically, a semiconductor laser diode, the stray light entering the optical device 102 degrades the performance, namely, the coherency of the laser diode.

SUMMARY OF THE INVENTION

One aspect of the present application relates to an optical receiver module that receives an optical signal. The optical receiver module includes an amplifier unit, a receiver unit, and a coupling unit. The amplifier unit includes an SOA that receiver the optical signal and outputs an amplified optical signal and a housing that encloses the SOA therein. The receiver unit includes a photodiode (PD) that receives the amplified optical signal coming from the SOA and another housing that encloses the PD therein. The coupling unit is fixed to the housing of the amplifier unit and the other housing of the receiver unit. The coupling unit has a bore that passes the amplified optical signal. A feature of the present receiver module is that the bore of the coupling unit has width smaller than a width of the housing of the amplifier unit along a direction perpendicular to an optical axis of the amplifier optical signal, and also smaller than a width of the other housing of the receiver unit along the direction perpendicular to the optical axis.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Some embodiments according to the present application will be described as referring to drawings. However, it is intended that the present invention is not limited to those particular embodiments and modification disclosed, but that the invention include all embodiments falling within the scope of the appended claims. In the description of the drawings, numerals or symbols same with or similar to each other will refer to elements same with or similar to each other without duplicated explanations.

Figure 1:
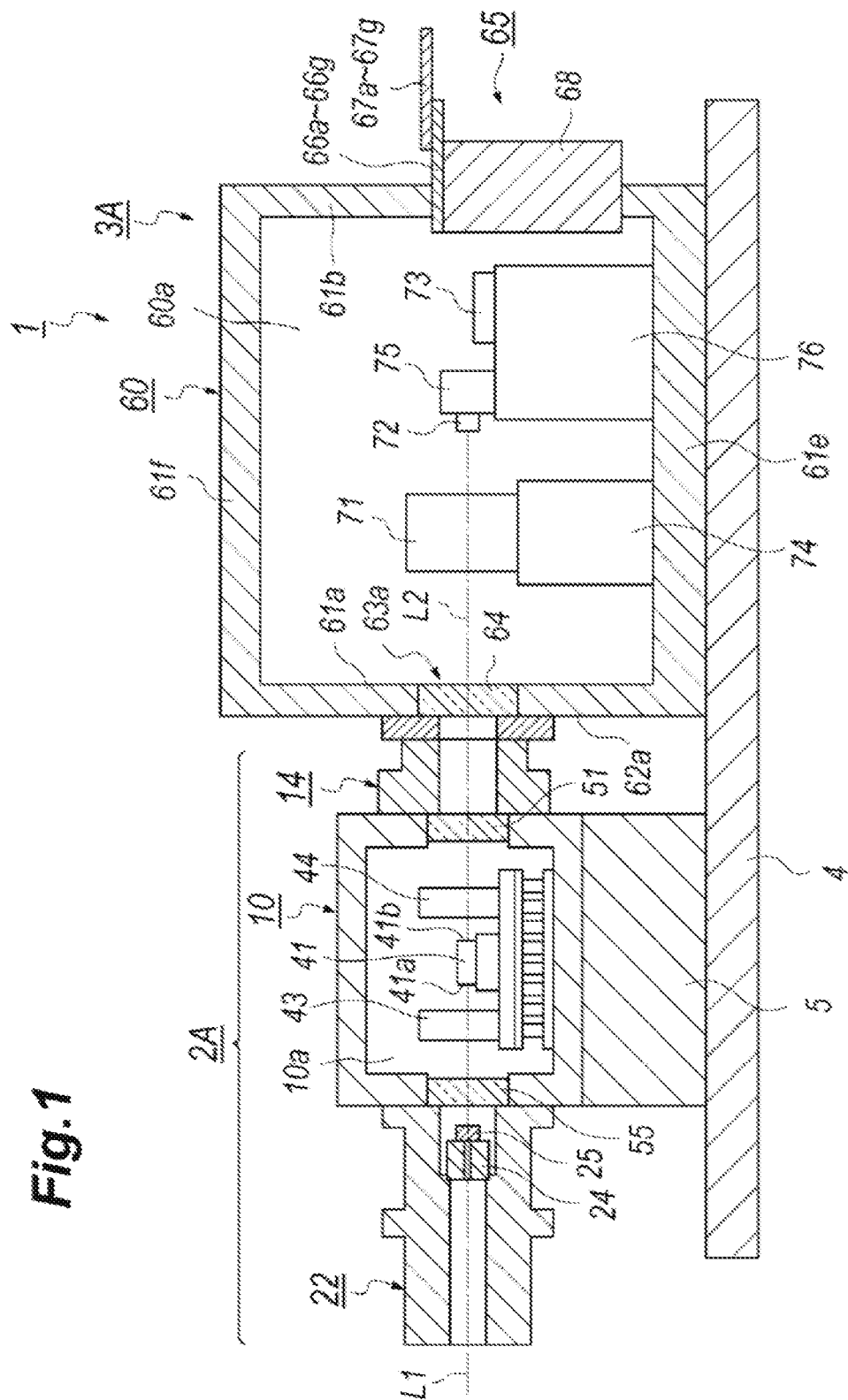
FIG. 1 is a side cross section of an optical receiver module according to an embodiment of the present application.
Figure 2:
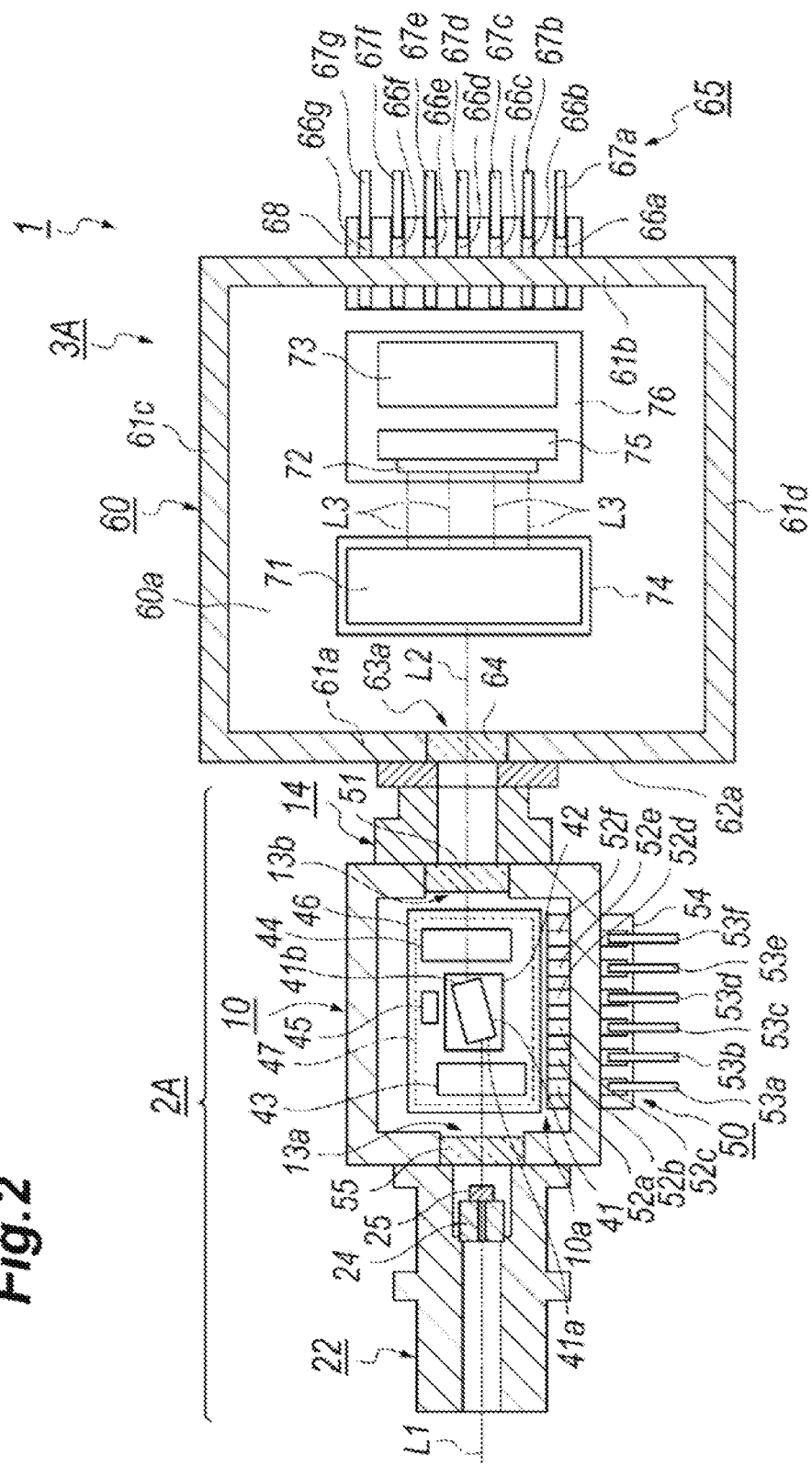
FIG. 2 is a horizontal cross section of the optical receiver module of the present application.
Figure 3:
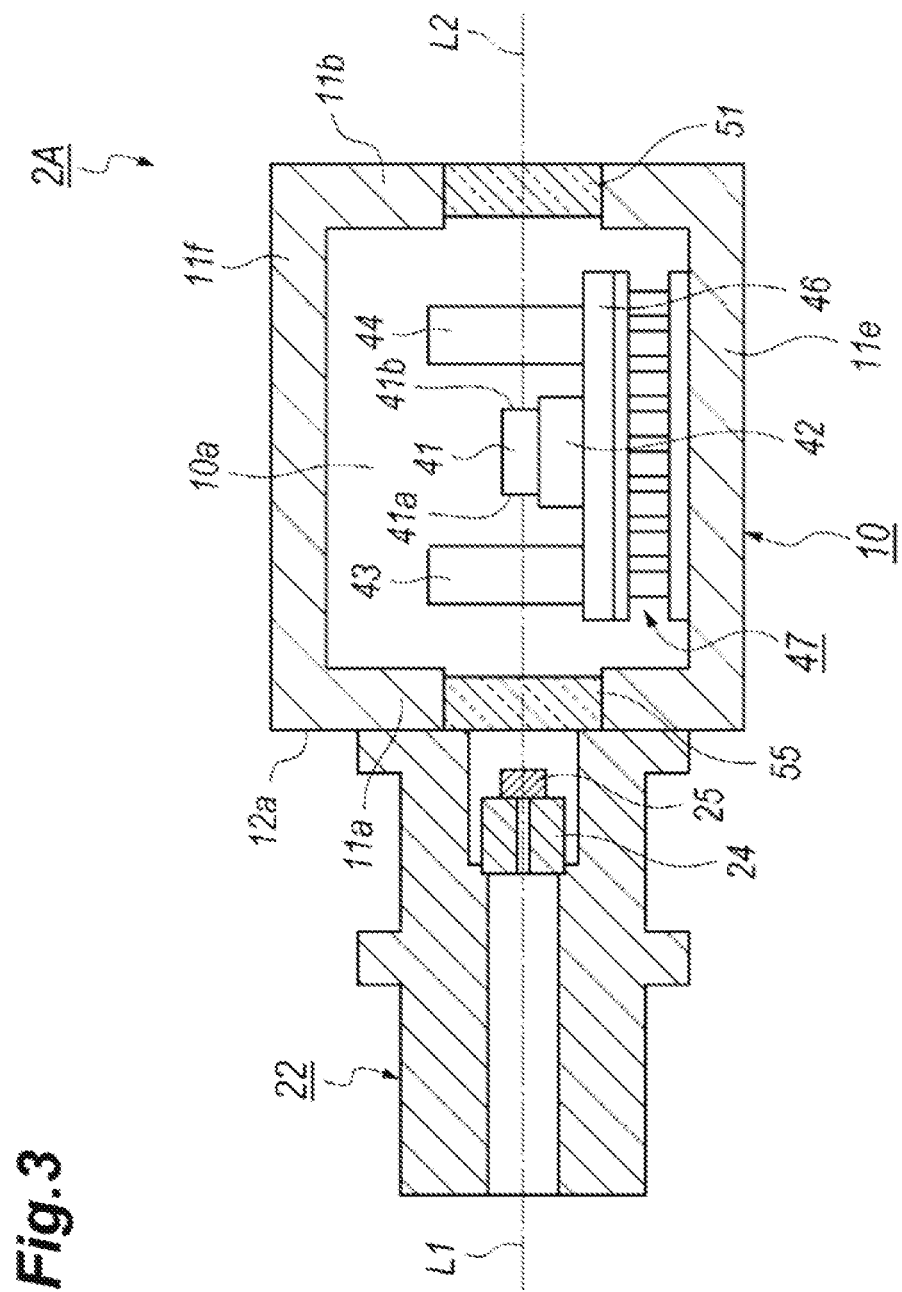
FIG. 3 is a side cross section of an amplifier unit of the optical receiver module shown in FIG. 1.
Figure 4:
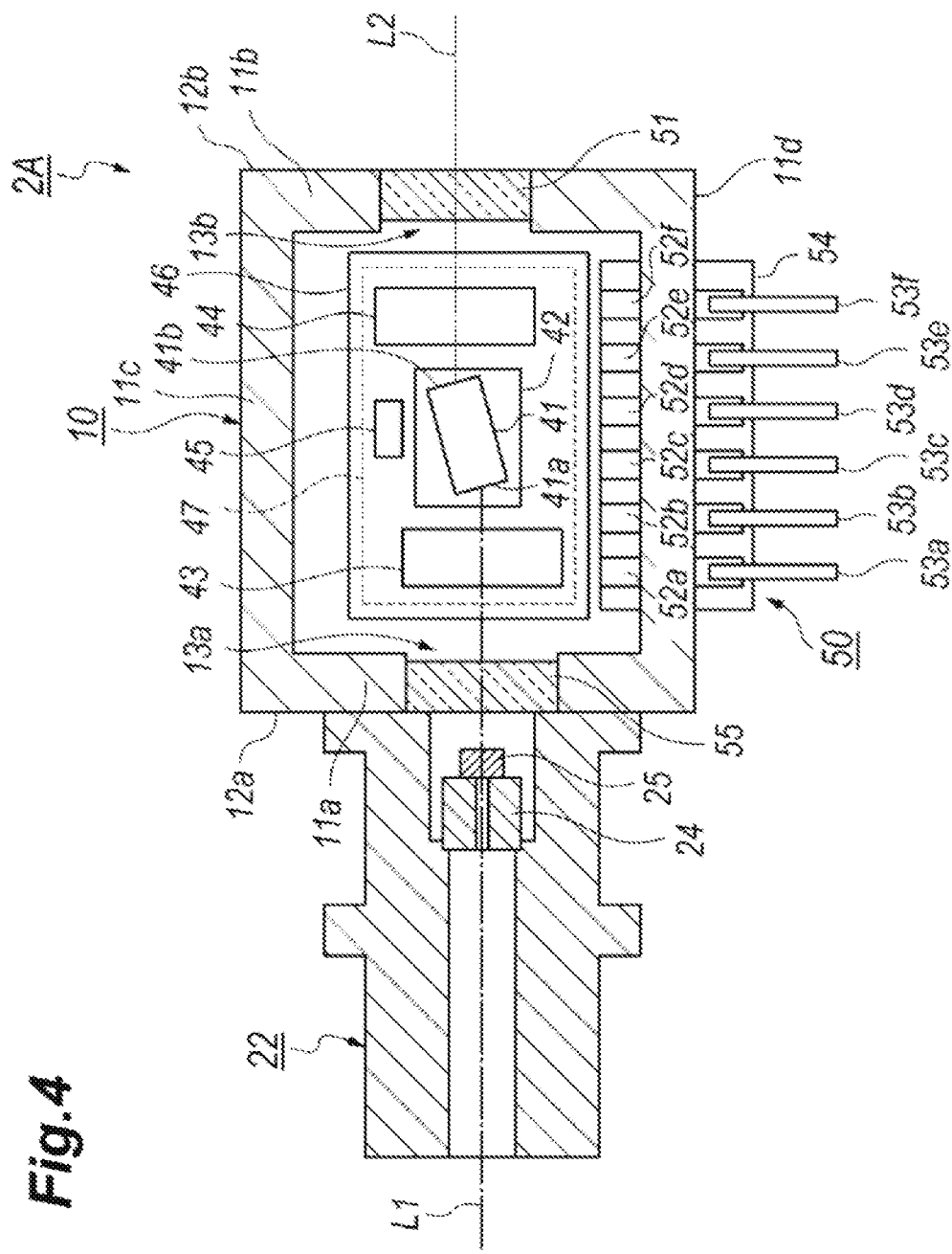
FIG. 4 is a horizontal cross section of the amplifier unit shown in FIG. 3.

FIGS. 1 and 2 show a side cross section and a plane cross section, respectively, of an optical receiver module 1; while, FIGS. 3 and 4 show a side cross section and a plane cross section of an amplifier unit 2A, respectively, comprising the optical receiver module 1. As illustrated in FIGS. 1 to 4, the optical amplifier module 1 of the present embodiment comprises an amplifier unit 2A, a receiver unit 3A, and a rear coupling unit 14. The amplifier unit 2A includes a semiconductor optical amplifier (SOA) 41 and a housing 10 that encloses the SOA 41 within a space 10a thereof. The receiving unit 3A includes a photodiode (PD) 72 optically coupled with the SOA 41 and a housing 60 that encloses the PD 72 within a space 60a thereof. The rear coupling unit 14, which is fixed to respective housings, 10 and 60, provides a bore to pass a rear optical axis L2 connecting the SOA 41 to the PD 72.

The amplifier unit 2A will be described in detail. As illustrated in FIGS. 3 and 4, the amplifier unit 2A includes the housing 10, a front coupling unit 22, the SOA 41, a window 51, and a concentrating lens 55. The housing 10, which has a box shape having side walls, 11a and 11b, facing to each other, other two side walls 11c and 11d, also facing to each other and extending in perpendicular to the former two side walls, 11a and 11b, a bottom 11e and a lid 11f. The side wall 11a will be called as the front wall, while, the side wall 11b will be called as the rear wall. However, these directions of "front" and "rear", of "forward" and "backward" are temporarily defined only for the explanation sake, and will not influence the scope of the invention. The side walls, 11a to 11d, and the lid 11f may be made of alloy containing iron (Fe), cobalt (Co), and nickel (Ni), which is often called as Kovar, while, the bottom may be made of copper-tungsten (CuW) having good thermal conductivity. The front wall 11a includes a front surface 12a, to which the front coupling unit 22 is fixed, and a front opening 13a that secures the concentrating lens 55 therein and passes a front optical axis L1 extending from the SOA 41. The rear wall 11b includes a rear surface 12b, to which the receiver unit 3A is fixed via the rear coupling unit 14, and a rear opening 13b that secures a window 51 therein and passes the rear optical axis L2 extending from the SOA 41 to the receiver unit 3A.

The housing 10 encloses, in addition to the SOA 41, a sub-carrier 42, a front collimating lens 43, a rear collimating lens 44, a thermistor 45, a carrier 46, and a thermos-electric cooler (TEC) 47. The carrier 46 on the top of the TEC 47 directly mounts the front and rear collimating lenses, 43 and 44, and the thermistor 45, but indirectly mounts the SOA 41 through the sub-carrier 42.

The SOA 41 may be primarily made of semiconductor materials including indium phosphide (InP) and other materials capable of growing on InP. The SOA 41 includes, on the n-type InP substrate, an n-type InP cladding layer, an active layer of the type of the multiple quantum well (MQW) comprising a plurality of well layers made of InGaAsP and a plurality of barrier layers made of InGaAsP alternately stacked to each other, and a p-type MP cladding layer, each epitaxially grown on the substrate in this order. The material of InGaAsP of the barrier layers has the composition different from InGaAsP of the well layer to cause the quantum well. The SOA 41, which is put between the front and rear collimating lenses, 43 and 44, has a front facet 41a optically coupled coupling with the front collimating lens 43 and a rear facet 41b optically coupled with the rear collimating lens 44. The respective facets, 41a and 41b, of the SOA 41 in respective normal are inclined with the optical axes, L1 and L2, to suppress light reflected thereby returning back to the MQW active layer. The SOA 41 is mounted on the TEC 47 via the carrier 46 and the sub-carrier 42 which may be preferably made of aluminum nitride (AlN). The TEC 47 may control a temperature of the SOA 41, while the thermistor 45 may sense a temperature of a top of the TEC 47, which may be regarded as the temperature of the SOA 41. The TEC 47 may have a type of a Peltier element.

The housing 10 further includes a terminal 50 passing through one of the side walls 11d to communicate electrically with an external apparatus. The terminal 50 includes a feedthrough 54, interconnections, 52a to 52f, and lead pins, 53a to 53f, where the interconnections, 52a to 52f, and the lead pins, 53a to 53f, are provided on the feedthrough 54. The interconnections, 52a to 52f, are electrically connected to the SOA 41, the thermistor 45, and the TEC 47 within the housing 10, while, they are attached to respective lead pins, 53a to 53f, in the outside of the housing 10. The feedthrough 54 may be made of ceramics, while, the interconnections, 52a to 52f, and the lead pins, 53a to 53f, may be made of metal covered by or plated with gold (Au).

The front coupling unit 22, which may be made of stainless steel and welded to the front surface 12a of the housing 10, passes the front optical axis L1 extending from the front facet 41a of the SOA 41. The front coupling unit 22 may be a type of the optical receptacle pluggably coupled with an external optical fiber, which is not illustrated in the figures. The front coupling unit 22 includes a stub 24 and an optical isolator 25 optically coupled with stub 24. The stub 24 is provided to couple pluggably with the external fiber. Specifically, the stub 24 may perform a physical contact (PC) in a side opposite to the optical isolator 25 between the external fiber secured in a ferruled, which is pluggably inserted into the bore of the front coupling unit 22, and a coupling fiber secured in a center of the stub. Thus, the optical coupling between the external optical fiber and the stub 24, or the SOA 41, in the housing 10. The isolator 25 transmits incoming light from the external optical fiber to the SOA 41, but cuts outgoing light from the SOA 41 externally.

The receiver unit 3A, as illustrated in FIGS. 1 and 2, provides the housing 60, an optical de-multiplexer 71, the PD 72, and an amplifier 73. The amplifier 73 may be a type of the trans-impedance amplifier (TIA) that convers a current signal into a voltage signal. The housing 60, which has a box shape similar to the aforementioned housing 10 for the amplifier unit 2A, provides side walls, 61a and 61b, other two side walls, 61c and 61d, extending in perpendicular to the former side walls, 61a and 61b, a bottom 61e and a lid 61f. The side wall 61a will be called as the front wall, while, the other side wall 61b opposite to the former side wall 61a will be called as the rear wall. The front wall 61a includes a front surface 62a, to which the rear coupling unit 14 is fixed, and a front opening 63a that secures a window 64 and passes the rear optical axis L2 coming from the rear facet 41b of the SOA 41 through the rear coupling unit 14.

The optical de-multiplexer 71, which optically couples with the rear facet 41b of the SOA 41 through the rear collimating lens 44, the rear window 51, the rear coupling unit 14, and the front window 64, receives wavelength multiplexed light output from the SOA 41 and de-multiplexes this light into respective optical signals depending on the wavelengths thereof. The PD 72 provides a plurality of PD elements arranged along a direction perpendicular to the optical axis L2. The PD elements receive respective optical signals, which are de-multiplexed by the optical de-multiplexer 71 and generate photocurrents. The amplifier 73, which provides a plurality of amplifier elements, convert the photocurrents provided from the PD elements into respective voltage signals and amplify these voltage signals to be output from the receiver unit 3A. The optical de-multiplexer 71 is mounted on the bottom 61e through the carrier 74, and the PD 72 is also mounted on the bottom 61e but through another carrier 76 and a sub-mount 75. The TIA 73 is mounted on the carrier 76. The carriers, 74 and 76, may be made of alloy containing iron (Fe), cobalt (Co), and nickel (Ni), which may be called as Kovar. The embodiment thus described concentrates on an arrangement that the SOA 41 receives the wavelength multiplexed light and the receiver unit 3A provides the optical de-multiplexer 71 and a plurality of PD elements, which is called as a wavelength division multiplexing (WDM) receiver. However, the present invention may be applicable to an amplifying module that receives light with a unique wavelength and the receiver unit installing only one PD for receiving the light.

The housing 60 of the receiver unit 3A provides a terminal 65 in the rear wall 61b thereof to communicate electrically with an external apparatus. The terminal 65 includes a plurality of interconnections, 66a to 66g, a plurality of lead pins, 67a to 67g, and a feedthrough 68. The interconnections, 66a to 66g, are connected in respective one ends to the PD elements and TIA 73 within the housing 60, and in other ends thereof fix the lead pins, 67a to 67g, in the outside of the housing 60. The feedthrough 68 may be made of ceramics, and the interconnections, 66a to 66g, and the lead pins, 67a to 67g, are covered or plated with gold (Au).

The rear coupling unit 14, which may be made of stainless steel and has a cylindrical shapes with a center substantially coincident with the rear optical axis L2 extending from the rear facet 41b of the SOA 41, is fixed to the rear surface 12b by, for instance, welding and in the other end thereof is fixed to the front surface 62a of the housing 60 also by welding. The rear coupling unit 14 passes the rear optical axis L2 coming from the rear facet 41b of the SOA 41. The rear coupling unit 14 may be made of, for instance, stainless steel.

Figure 5:
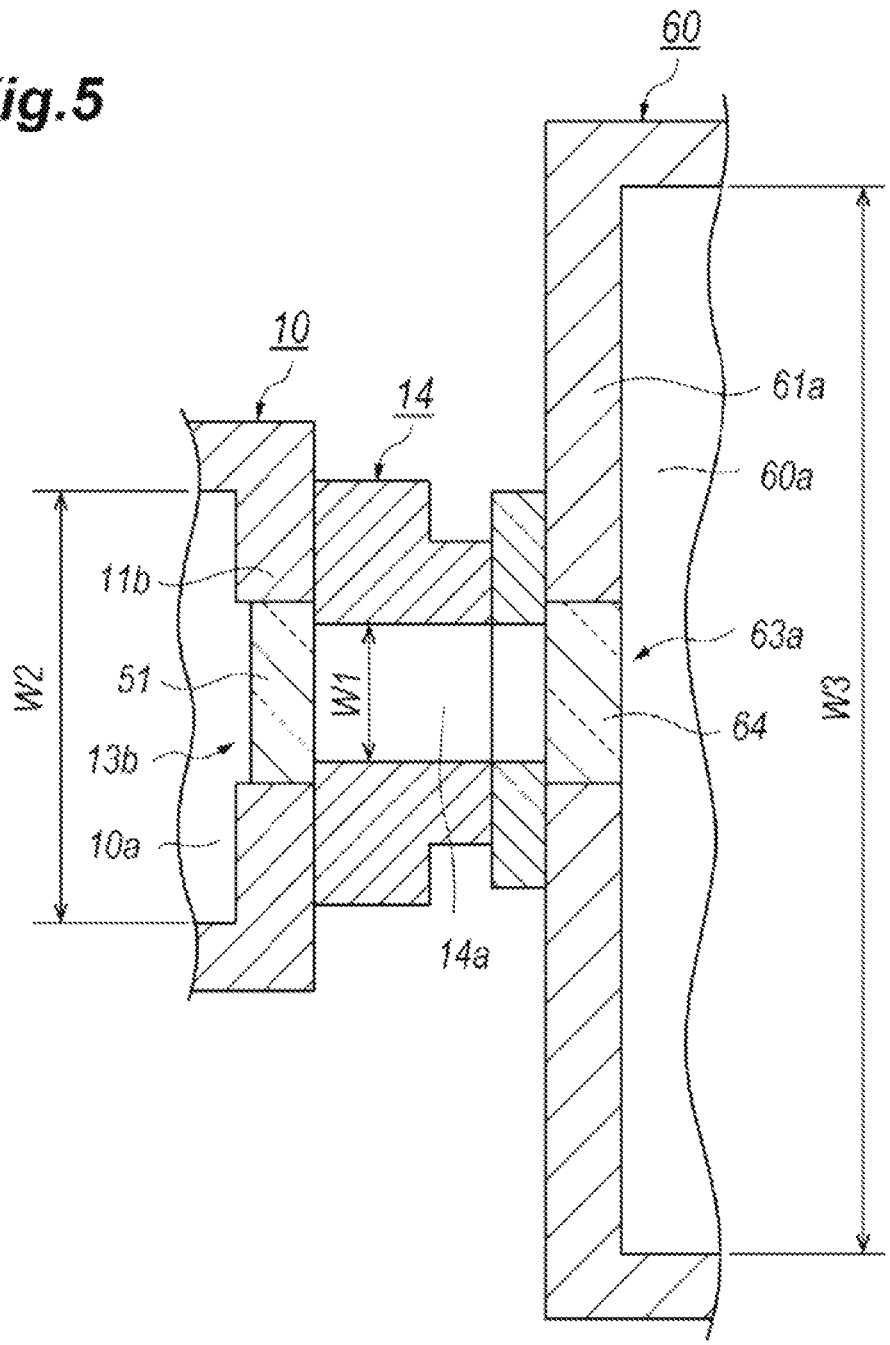
FIG. 5 is a side cross section of the coupling unit shown in FIG. 1.

FIG. 5 is magnified view of a cross section of the rear coupling unit 14. The rear coupling unit 14 provides a bore 14a through which the rear optical axis L2 passes. The bore 14a in one end thereof continues to the rear opening 13b of the housing 10 of the amplifier unit 2A, and in the other end continues to the front opening 63a of the other housing 60 of the receiver unit 3A. The bore 14a has a minimum width, namely, a minimum diameter W1 smaller than a width W2 of the inner space 10a of the housing 10 and a width W3 of the inner space 60a of the housing 60.

Referring to FIG. 1 again, the amplifier unit 2A and the receiver unit 3A are installed on a heat sink 4, which may be made of metal, for instance, aluminum (Al). The housing 10 and the other housing 60 usually have respective sizes because respective housings install electrical and optical components whose counts and sizes are different from others. When a distance from the rear optical axis L2 to the bottom 11e of the housing 10 becomes different from a distance from the rear optical axis L2 to the bottom 61e of the other housing 60, in particular, when the former distance is shorter than the latter distance, a spacer 5 may be put between the housing 10 and the heat sink 4 as shown in FIG. 1 to compensate the difference in the distances above described. The spacer 5 may be made of material having good thermal conductivity because the spacer 5 operates as a material to dissipate heat from the amplifier unit 2A to the heat sink 4. Thus, the spacer 5 may be made of CuW, copper molybdenum (CuMo), or aluminum (Al).

Tolerances in various parameters, for instance, the physical dimensions of the housings, 10 and 60, the welding of the rear coupling unit 14 to the housing, 10 and 60, the physical dimensions of the TEC 47, the carriers 46, 74 and 76, the sub-carrier 42, the sub-mount 75, and so on causes the discrepancy of the levels of respective optical axes, L1 and L2, measured from the heat sink 4. Some members or materials inevitably compensate the discrepancy in the levels of the optical axes, L1 and L2. In the optical receiver module according to the present invention, the amplifier unit 2A generates greater heat compared with the receiver unit 3A, in particular, the TEC 47 generates greater heat to cool the temperature of the SOA 41 down to a level to operate the SOA 41 stably. Accordingly, when the receiver unit 3A is tightly attached to the heat sink 4 but the amplifier unit 2A accompanies a member to adjust the discrepancy; the function to dissipate heat from the amplifier unit 2A to the heat sink 4 is to be failed. An arrangement, where the amplifier unit 2A is in tightly contact with the heat sink 4 and the receiver unit 3A is in contact with the heat sink 4 as interposing a member to compensate the tolerances above, is preferable.

Figure 11:
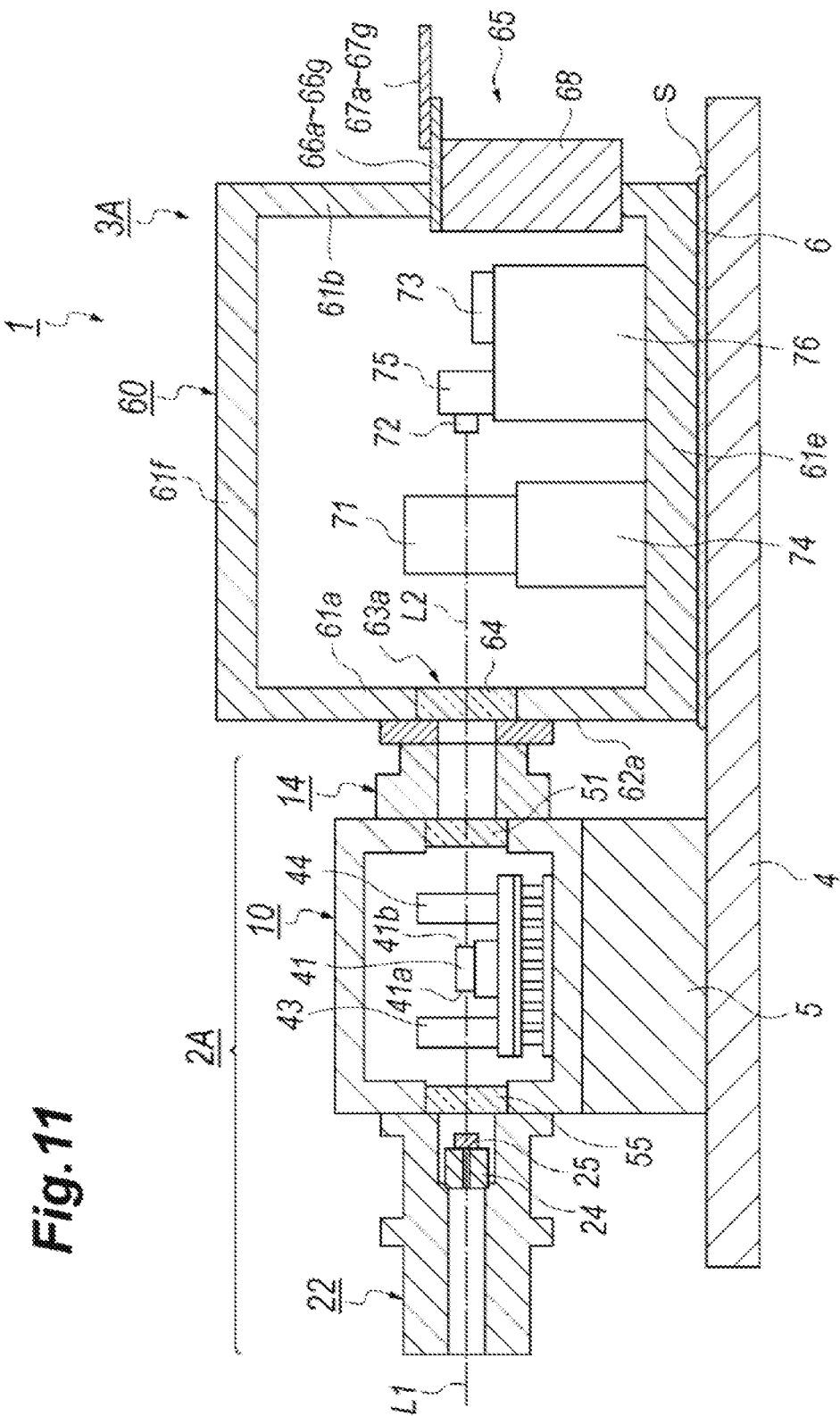
FIG. 11 is a side cross section of an optical receiver module that provides a member including thermal grease or a thermal sheet under the receiver unit.

FIG. 11 is a side cross section showing an example of the arrangement where the receiver unit 3A puts a member 6 against the heat sink 4. The member 6 may be a thermal sheet and/or thermal grease 6 flexibly filling the gap S formed between the housing 60 and the heat sink 4. Specifically, the spacer 5 has a height greater than a sum of tolerances due to the physical dimensions of the housings, 10 and 60, and so on by one (1) millimeter. Under such an arrangement, the spacer 5 is tightly in contact with the heat sink 4 without any gaps, but the housing 60 of the receiver unit 3A causes a gap S of 1 to 2 millimeters. This gap S is filled with thermal grease 6, or a thermal sheet. Thus, the discrepancy of the levels between the optical axes, L1 and L2, measured from the heat sink 4 may be compensated without degrading the heat dissipating function of the amplifier unit 2A.

Figure 6:
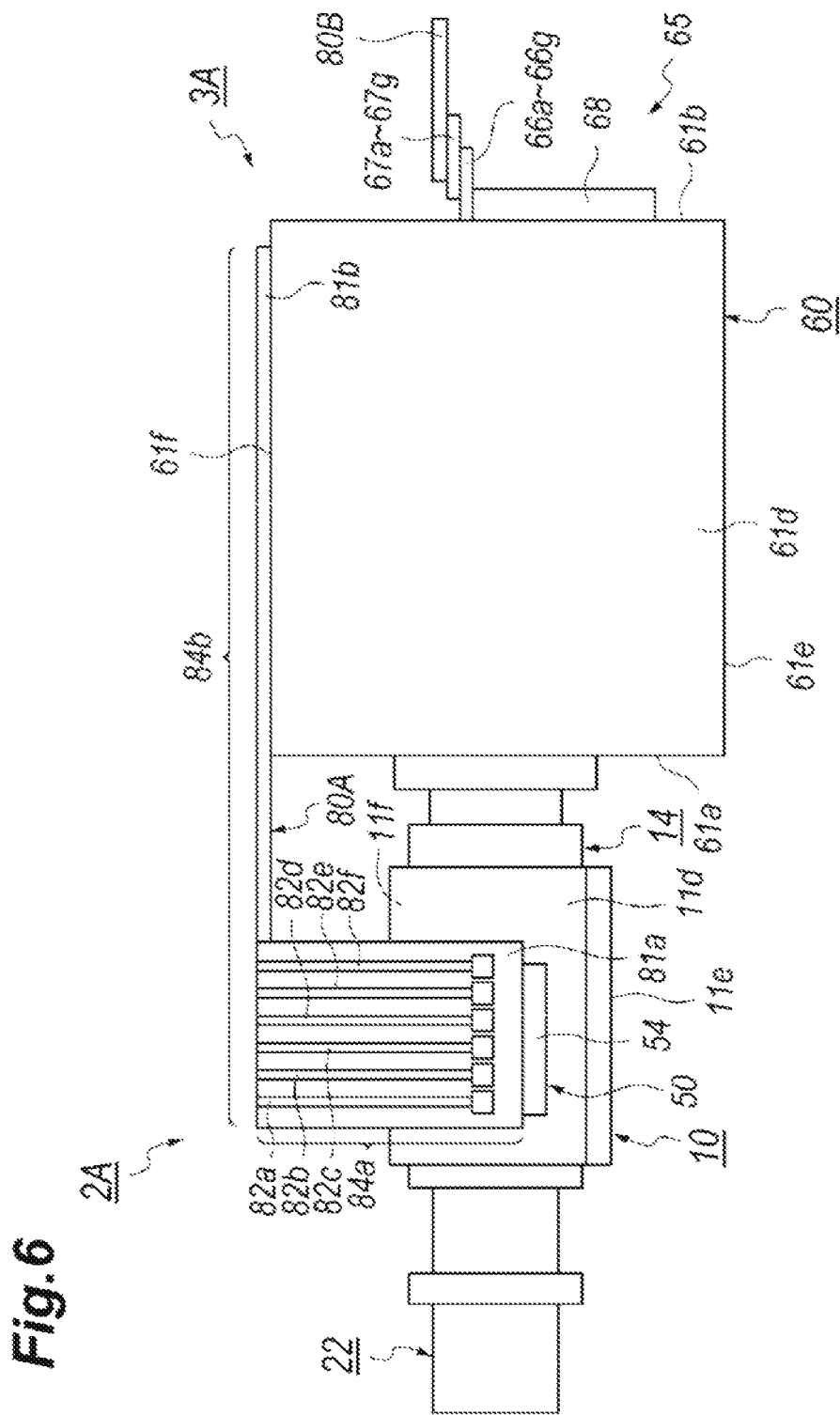
FIG. 6 is a side view of the optical receiver module that accompanies flexible printed circuit boards connected to the amplifier unit and the receiver unit.
Figure 7:
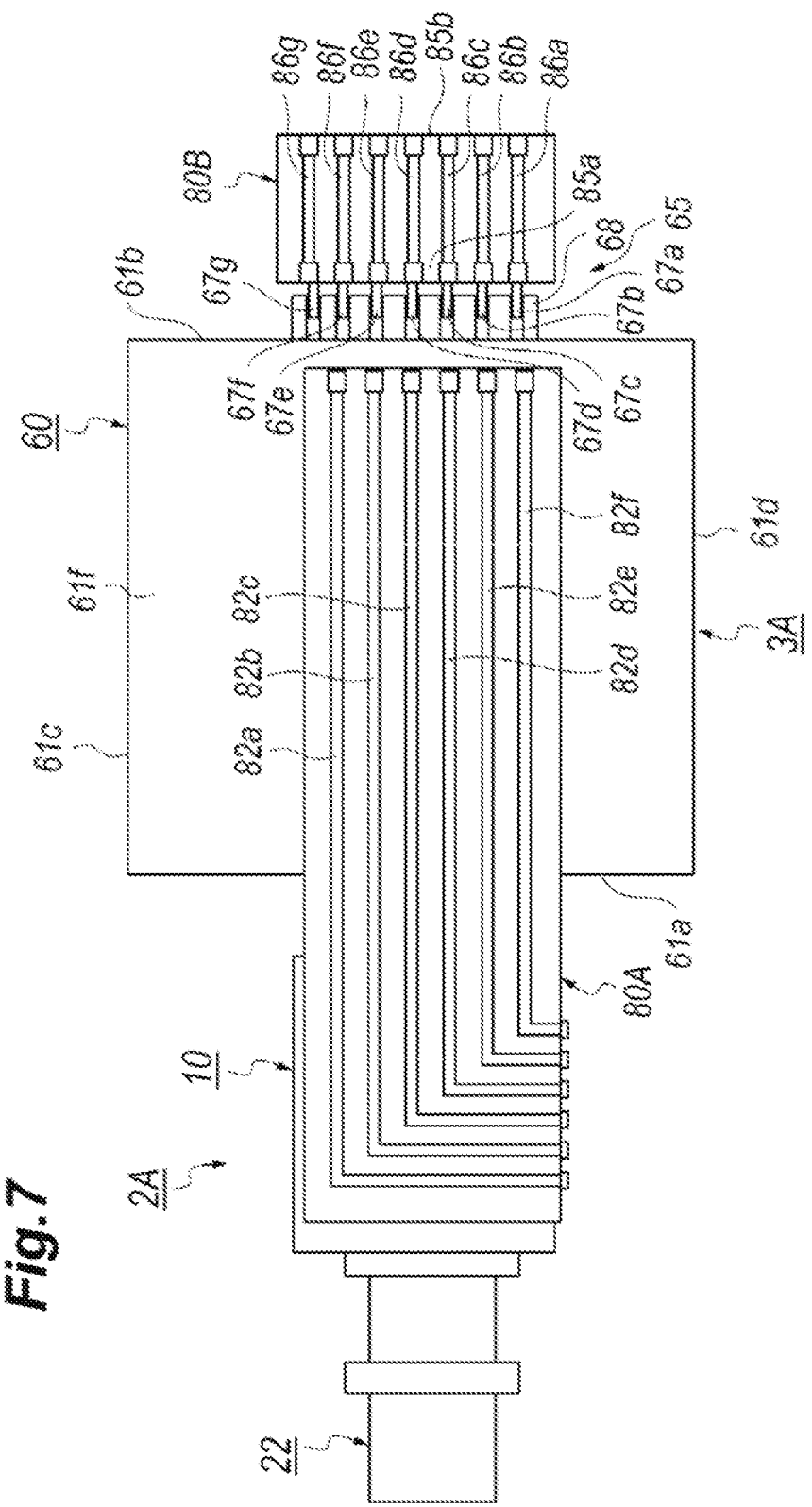
FIG. 7 is a plan view of the optical receiver module accompanying with the flexible printed circuit boards.

Next, an electrical interface to the amplifier unit 2A and the receiver unit 3A will be described. FIGS. 6 and 7 are side and plan views, respectively, of the optical receiver module 1 that connects flexible printed circuit (FPC) boards, 80A and 80B, to the lead pins, 53a to 53f and 67a to 67g.

The first FPC board 80A provides two ends, 81a and 81b, and conductive patterns, 82a to 82f, extending from the one end 81a to the other end 81b. The one end 81a is connected to the terminal 50 of the amplifier unit 2A. That is, the conductive patterns, 82a to 82f, are electrically connected or soldered to the lead pins, 53a to 53f. The first FPC board 80A of the present embodiment provides the conductive patterns, 82a to 82f, in an outer side thereof; but the FPC board 80A may form the conductive patterns, 82a to 82f, in an inner side facing the housing 10 of the amplifier unit 2A, or the FPC board 80A may embed the conductive patterns, 82a to 82f.

The first FPC board 80A may form rooms in both sides of the amplifier unit 2A. Specifically, the first FPC board 80A extends from the end 81a upward along the side wall 11d in a portion 84a thereof, and extends in another portion 84b thereof toward the receiver unit 3A along and in parallel to the lid 11f of the amplifier unit 2A and the lid 61f of the receiver unit 3A. Because of this arrangement of the first FPC board 80A, the housing 10 of the amplifier unit 2A forms rooms in respective sides thereof to which other electrical components may be disposed.

The second FPC board 80B also provides two ends, 85a and 85b, and conductive patterns, 86a to 86g, between two ends, 85a and 85b. The conductive patterns, 86a to 86g, are soldered to the lead pins, 67a to 67g, of the receiver unit 3A in one ends 85a thereof. The second FPC board 80B extends from the lead pins, 67a to 67g, rearward. That is, the end 81b of the first FPC board 80A and the end 85b of the second FPC board 80B extend substantially in parallel in a rear portion of the optical receiver module 1.

Next, advantages of the optical receiver module 1 thus configured will be described. The optical amplifier module 1 of the present invention passes light from the amplifier unit 2A to the receiver unit 3A through the rear coupling unit 14. The bore 14a of the rear coupling unit 14 has a width, or a diameter, W1 smaller than a width W2 of the space 10a of the housing 10 and a width W3 of the space 60a of the housing 60. Stray light generated by the SOA 41, such ASE, may be cut in a substantial part thereof by the rear coupling unit 14, and the receiver unit 3A may reduce optical noises affected to the PD 72. Moreover, the rear coupling unit 14 is rigidly assembled with the amplifier unit 2A and the receiver unit 3A; the optical receiver module 1 of the present embodiment may enhance the installation thereof.

The first and second FPC boards, 80A and 80B, are extended rearward substantially in parallel to each other, which makes the electrical connection of the FPC boards, 80A and 80B, simple and resultantly enhances the installation of the optical receiver module 1.

The optical receiver module 1 of the present embodiment provides the heat sink 4 and the spacer 5 between one of the housings, 10 and 60, and the heat sink 4. Because the amplifier unit 2A installs the TEC 47 which generate greater heat compared with elements installed within the receiver unit 3A. Accordingly, the housing 10 of the amplifier unit 2A is preferably to be directly and closely in contact to the heat sink 4 via the spacer 5. A flexible member or material having good thermal conductivity is preferably put between the housing 60 of the amplifier unit 3A and the heat sink 4 to compensate the mechanical tolerances of the housings, 10 and 60, the fixation of the rear coupling unit 14, and so on without accompanying with substantial reduction of the heat dissipation from the housing 60 to the heat sink 4.

(First Modification)

Figure 8:
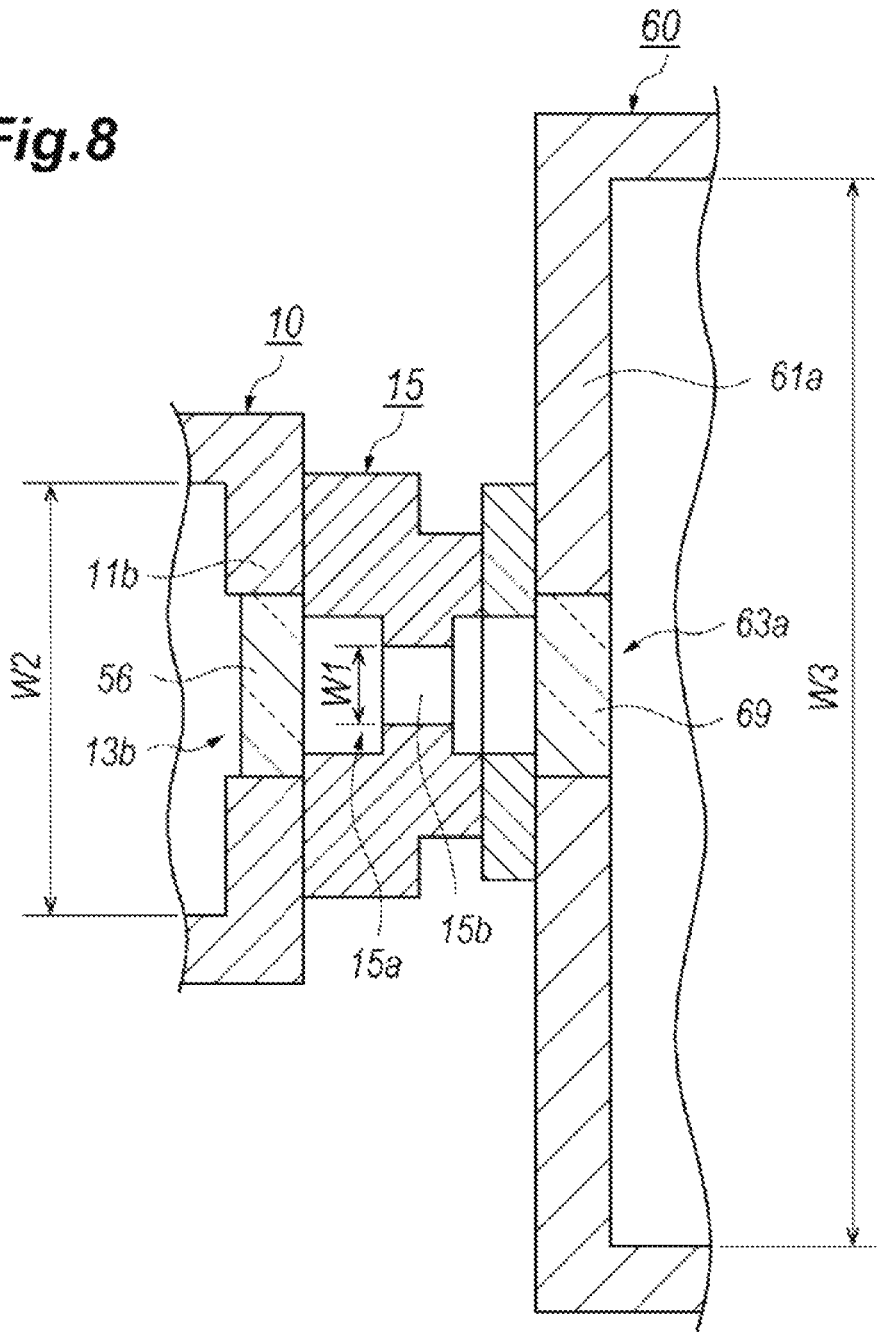
FIG. 8 is a side cross section of a modified coupling unit.

FIG. 8 shows a cross section of a rear coupling unit 15 modified from the aforementioned coupling unit 14. The modified coupling unit 15 accompanies with, substituting from the windows, 51 and 64, rear and front concentrating lenses, 56 and 69, respectively.

The rear coupling unit 15, which also has a cylindrical shape with a center aligned with the rear optical axis L2, has one end fixed to the rear wall 12b of the housing 10 by, for instance, welding, and another end fixed to the front wall 62a of the housing 60 also by welding. The rear coupling unit 15 may be made of, for instance, stainless steel. A feature of the modified rear coupling unit 15 is that the rear coupling unit 15 has the bore 15a for passing the rear optical axis and the bore 15a provides a constricted portion 15b whose width or diameter W1 further narrower than a diameter of the bore 15a and widths, W2 and W3, of the housings, 10 and 60, respectively.

Another feature of the present modified embodiment is that the rear opening 13b of the housing 10 and the front opening 63a of the other housing 60 secures, instead of the window, 51 and 64, respective concentrating lenses, 56 and 69, to concentrate the light coming from the rear facet 41b of the SOA 41 at the bore 15a, which enables the bore 15a of the rear coupling unit 15 to be further narrowed and reduce the influence of the stray light caused primarily by the ASE of the SOA 41 to the PD 72.

(Second Modification)

Figure 9:
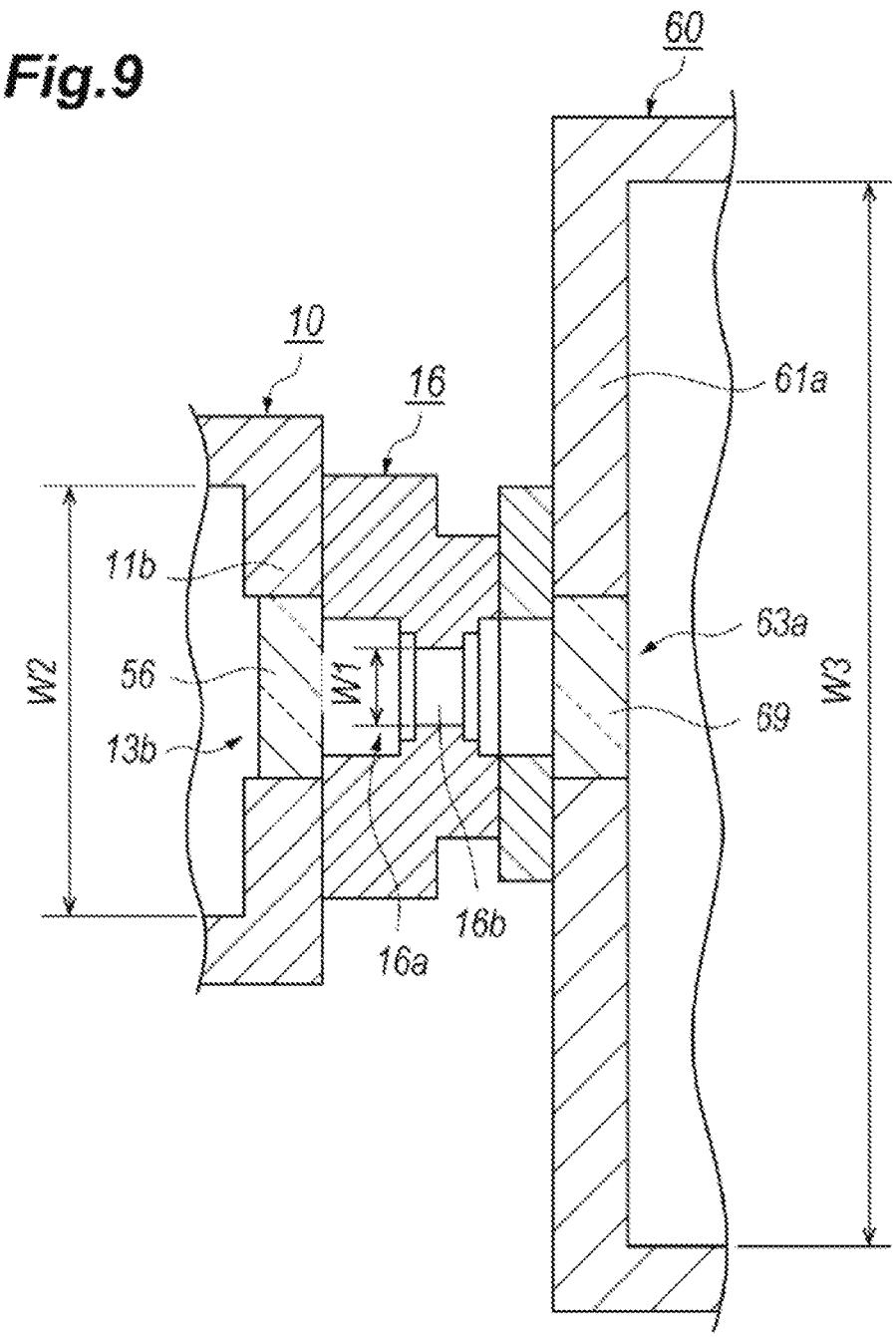
FIG. 9 is a side cross section of a coupling unit still modified from the coupling unit shown in FIG. 8.
Figure 10:
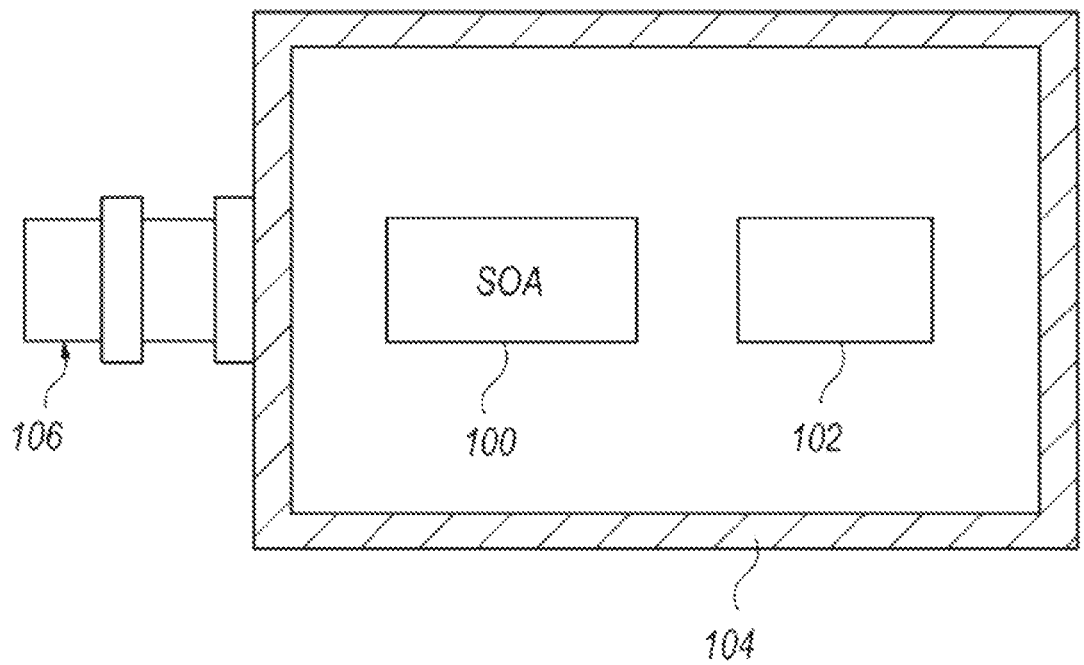
FIG. 10 schematically shows a functional block diagram of a conventional optical module that provides an SOA in the housing thereof.

FIG. 9 illustrates the rear coupling unit 16 according to the second modification of the aforementioned embodiment. The rear coupling unit 16 has a feature distinguishable from the aforementioned rear coupling unit, 14 and 15, that the bore 16a thereof is further narrowed. Specifically, the bore 16a is narrowed stepwise from the side of the housing 10 and also from the side of the other housing 60, and provides the narrowest portion 16b in halfway between two housings, 10 and 60. The narrowest width or diameter of the bore 16a is smaller than respective widths, W2 and W3, of the housings, 10 and 60. The housings, 10 and 60, provide concentrating lenses, 56 and 69, in the rear opening 13b and the front opening 63a thereof. Accordingly, even when the rear coupling unit 16 has such a narrowed bore 16a, the light coming from the rear facet 41b of the SOA 41 may reliably enter the PD 72 in the housing 60, but the stray light caused by the ASE of the SOA 41 may be effectively prevented from entering the housing 60.

Although the present invention has been fully described in conjunction with the preferred embodiments and modifications thereof with reference to the accompanying drawings, it is to be understood that various changes and modifications may be apparent to those skilled in the art. Such changes and modifications are to be understood as included within the scope of the present invention as defined by the appended claims.

What is claimed is:

1. An optical receiver module that receives an optical signal, comprising:
   an amplifier unit providing a semiconductor optical amplifier (SOA) and a housing that encloses the SOA therein, the SOA receiving the optical signal and outputting an amplifier optical signal;
   a receiver unit providing a photodiode (PD) and another housing that encloses the PD therein; and
   a coupling unit fixed to the housing of the amplifier unit and the another housing of the receiver unit, the coupling unit providing a bore that passes the amplified optical signal,
   wherein the bore has a width smaller than a width of the housing along a direction perpendicular to an optical axis of the amplifier optical signals, and a width of the another housing along the direction,
   wherein the housing provides an opening in a side wall to which the coupling unit is fixed, the another housing provides another opening in a side wall to which the coupling unit is fixed,
   wherein the opening in the housing and the opening in the another housing secures respective concentrating lenses therein, and
   wherein the bore of the coupling unit narrows stepwise from a side of the side wall of the housing, the bore providing a narrowest portion in halfway between the housing and the another housing.

2. The optical receiver module of claim 1,
   wherein the coupling unit is fixed to the housing of the amplifier unit by welding, and to the another housing of the receiver unit by welding.

3. The optical receiver module of claim 2,
   wherein the housing of the amplifier unit includes side walls made of alloy containing iron (Fe), cobalt (Co), and nickel (Ni), and a bottom made of copper tungsten (CuW),
   wherein the another housing of the receiver unit includes side walls made of allow containing iron (Fe), cobalt (Co), and nickel (Ni), and a bottom made of copper tungsten (CuW), and
   wherein the coupling unit is fixed to one of the side walls of the housing of the amplifier unit and to one of the side walls of the another housing of the receiver unit.

4. The optical receiver module of claim 1,
   further comprising a heat sink that mounts the housing of the amplifier unit via a spacer and the another housing of the receiver unit.

5. The optical receiver module of claim 4,
   wherein the housing of the amplifier unit is directly fixed to the spacer, and the spacer is directly fixed to the heat sink, and
   wherein the another housing of the receiver unit is indirectly fixed to the heat sink via thermal member including a thermal sheet and thermal grease.

6. The optical receiver module of claim 4,
   wherein the heat sink is made of aluminum (Al) and the spacer is made of material including aluminum (Al), copper tungsten (CuW), and copper molybdenum (CuMo).

7. The optical receiver module of claim 6,
   wherein the amplifier unit encloses a thermos-electric cooler.

8. The optical receiver module of claim 4,
   wherein the amplified optical signal has an optical axis having a level measured from the heat sink equal to a level of an optical axis of the optical signal measured from the heat sink.

9. The optical receiver module of claim 1,
   further comprising another coupling unit fixed to the housing of the amplifier unit,
   wherein the another coupling unit pluggably receives an external optical fiber from which the optical signal is provided.

10. The optical receiver module of claim 9,
wherein the housing of the amplifier unit provides side walls, the coupling unit being fixed to the one of the side walls, the another coupling unit being fixed to another of the side walls opposite to the one of the side walls.

11. The optical receiver module of claim 10,
wherein the another of the sides walls provides an opening that passes the optical signal coming from the another coupling unit, and
wherein the opening secures a concentrating lens therein.

12. An optical receiver module that receives an optical signal, comprising:
an amplifier unit providing a semiconductor optical amplifier (SOA) and a housing that encloses the SOA therein, the SOA receiving the optical signal and outputting an amplifier optical signal;
a receiver unit providing a photodiode (PD) and another housing that encloses the PD therein;
a coupling unit fixed to the housing of the amplifier unit and the another housing of the receiver unit, the coupling unit providing a bore that passes the amplified optical signal; and
a heat sink that mounts the housing of the amplifier unit via a spacer and the another housing of the receiver unit,
wherein the bore has a width smaller than a width of the housing along a direction perpendicular to an optical axis of the amplifier optical signals, and a width of the another housing along the direction,
wherein the housing of the amplifier unit is directly fixed to the spacer, and the spacer is directly fixed to the heat sink, and
wherein the another housing of the receiver unit is indirectly fixed to the heat sink via thermal member including a thermal sheet and thermal grease.

13. The optical receiver module of claim 12,
wherein the housing provides an opening in a side wall to which the coupling unit is fixed, the another housing provides another opening in a side wall to which the coupling unit is fixed, and
wherein the opening in the housing and the opening in the another housing secures respective windows therein.

14. The optical receiver module of claim 12,
wherein the coupling unit is fixed to the housing of the amplifier unit by welding, and to the another housing of the receiver unit by welding.

15. The optical receiver module of claim 14,
wherein the housing of the amplifier unit includes side walls made of alloy containing iron (Fe), cobalt (Co), and nickel (Ni), and a bottom made of copper tungsten (CuW),
wherein the another housing of the receiver unit includes side walls made of allow containing iron (Fe), cobalt (Co), and nickel (Ni), and a bottom made of copper tungsten (CuW), and
wherein the coupling unit is fixed to one of the side walls of the housing of the amplifier unit and to one of the side walls of the another housing of the receiver unit.

16. The optical receiver module of claim 12,
wherein the heat sink is made of aluminum (Al) and the spacer is made of material including aluminum (Al), copper tungsten (CuW), and copper molybdenum (CuMo).

17. The optical receiver module of claim 12,
wherein the amplified optical signal has an optical axis having a level measured from the heat sink equal to a level of an optical axis of the optical signal measured from the heat sink.

18. The optical receiver module of claim 12,
further comprising another coupling unit fixed to the housing of the amplifier unit,
wherein the another coupling unit pluggably receives an external optical fiber from which the optical signal is provided.

19. The optical receiver module of claim 18,
wherein the housing of the amplifier unit provides side walls, the coupling unit being fixed to the one of the side walls, the another coupling unit being fixed to another of the side walls opposite to the one of the side walls.

20. The optical receiver module of claim 19,
wherein the another of the sides walls provides an opening that passes the optical signal coming from the another coupling unit, and
wherein the opening secures a concentrating lens therein.

* * * * *